(12) United States Patent
Harper, Jr. et al.

(10) Patent No.: US 6,354,850 B1
(45) Date of Patent: Mar. 12, 2002

(54) ELECTRICAL CONNECTOR WITH FEATURE FOR LIMITING THE EFFECTS OF COEFFICIENT OF THERMAL EXPANSION DIFFERENTIAL

(75) Inventors: Donald K. Harper, Jr., Harrisburg; Thomas D. Moyer; James A. Kopec, both of Mechanicsburg, all of PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 09/458,145

(22) Filed: Dec. 9, 1999

Related U.S. Application Data (60) Provisional application No. 60/112,397, filed on Dec. 15, 1998.

(51) Int. Cl.[7] .............................................. H01R 12/00
(52) U.S. Cl. ......................................... 439/83; 439/876
(58) Field of Search .................. 439/83, 876; 361/774, 361/777, 779; 257/737, 738, 788

(56) References Cited

U.S. PATENT DOCUMENTS

| | | | |
|---|---|---|---|
| 3,243,498 A | * 3/1966 | Allen et al. ................... | 439/83 |
| 4,577,923 A | * 3/1986 | Ikemizu ...................... | 439/876 |
| 4,893,172 A | 1/1990 | Matsumoto et al. | |
| 5,477,082 A | 12/1995 | Buckley, III et al. | |
| 5,497,545 A | * 3/1996 | Watanabe et al. ............. | 439/83 |
| 5,557,502 A | 9/1996 | Banerjee et al. | |
| 5,583,378 A | 12/1996 | Marrs et al. | |
| 5,585,162 A | * 12/1996 | Schueller .................... | 439/83 |
| 5,602,422 A | 2/1997 | Schueller et al. | |
| 5,610,436 A | 3/1997 | Sponaugle et al. | |
| 5,640,052 A | 6/1997 | Tsukamoto | |
| 5,736,790 A | 4/1998 | Iyogi et al. | |
| 5,763,059 A | 6/1998 | Yamaguchi et al. | |
| 5,768,774 A | 6/1998 | Wilson et al. | |
| 5,784,262 A | 7/1998 | Sherman | |
| 6,048,232 A | 4/2000 | Chen | |
| 6,114,763 A | * 9/2000 | Smith ......................... | 257/738 |
| 6,140,707 A | * 10/2000 | Plepys et al. ................ | 257/778 |

FOREIGN PATENT DOCUMENTS

| | | |
|---|---|---|
| WO | WO 98/15989 | 4/1998 |

* cited by examiner

*Primary Examiner*—Tho D. Ta
(74) *Attorney, Agent, or Firm*—Steven M. Reiss; M. Richard Page (57) ABSTRACT

An insulative housing for an electrical connector, including: a base; and at least one aperture extending through said base for receiving a contact. The aperture has an enlarged opening at one end adapted to receive a fusible element for securing the connector to a substrate. The enlarged portion has a cross-sectional area, in one orientation, that can be larger than the cross-sectional areas of other orientations. An electrical connector housing, including: a base; and a plurality of apertures in the base for receiving a contact. Each aperture has a recess for receiving a portion of a fusible element therein. Each recess has a characteristic, with the characteristic of a portion of the recesses being different than the characteristic of the other recesses. A method of limiting the effects of the differential coefficient of thermal expansion of an electrical connector and a substrate to which the connector mounts, including the steps of: providing an electrical connector with a housing having an array of recesses that receive fusible elements to secure the connector to the substrate; defining at least one predetermined location on the housing; and manipulating the recesses located in the at least one predetermined location.

2 Claims, 9 Drawing Sheets

ELECTRICAL CONNECTOR WITH FEATURE FOR LIMITING THE EFFECTS OF COEFFICIENT OF THERMAL EXPANSION DIFFERENTIAL

CROSS-REFERENCE TO RELATED APPPLICATIONS

This application claims the benefit of U.S. Provisional Patent Application No. 60/112,397, filed on Dec. 15, 1998 and herein incorporated by reference.

BACKGROUND OF THE INVENTION

1. Field of the Invention

The present invention relates to electrical connectors. More specifically, the present invention relates to the connector housings used in electrical connectors that are mounted to a substrate using surface mount techniques (SMT) such as ball grid array (BGA) technology.

2. Brief Description of Earlier Developments

Typically, the materials forming the housing of an electrical connector differ from the materials forming the substrate to which the connector secures. Materials used to make the connector housing can include high temperature plastics, such as liquid crystal polymers (LCP). Materials used to make the substrate can include thermosetting laminates such as FR4 glass-filled epoxy resin. In this example, and as is typical with most connector systems, the connector housing material has a different coefficient of thermal expansion (CTE) than the substrate material.

The effects of the mismatch in CTE differential occur during thermal cycling. During thermal cycling, the disparate materials expand and contract at different rates. The differential expansion and contraction introduces stresses at the junctions between the substrate and the connector. These stresses could reduce the lifetime of the connector or could possibly cause a fracture to the junction between the connector and the substrate.

Reducing the effects of CTE differential is an important consideration in connectors that utilize SMT, and in particular BGA technology. In particular because the fusible elements that secure the connector to the substrate serves as the primary electrical path between the contacts and the substrate.

SUMMARY OF THE INVENTION

It is an object of the present invention to provide an improved electrical connector.

It is a further object of the present invention to provide an electrical connector that reduces the effects of CTE differential.

It is a further object of the present invention to provide an electrical connector having a strengthened junction between the connector and the substrate to which the connector attaches.

It is a further object of the present invention to provide an electrical connector that limits the effects of CTE differential by manipulating certain features of the connector housing.

It is a further object of the present invention to provide an electrical connector in which certain characteristics of the connector housing are changed to limit the effects of CTE differential.

It is a further object of the present invention to provide an electrical connector with strengthened sections in preferential failure locations.

These and other objects of the present invention are achieved in one aspect of the present invention by an insulative housing for an electrical connector, comprising: a base; and at least one aperture extending through said base for receiving a contact. The aperture has an enlarged opening at one end adapted to receive a fusible element for securing the connector to a substrate. The enlarged portion has a cross-sectional area, in one orientation, that can be larger than the cross-sectional areas of other orientations.

These and other objects of the present invention are achieved in another aspect of the present invention by an electrical connector housing, comprising: a base; and a plurality of apertures in the base for receiving a contact. Each aperture has a recess for receiving a portion of a fusible element therein. Each recess has a characteristic, with the characteristic of a portion of the recesses being different than the characteristic of the other recesses.

These and other objects of the present invention are achieved in another aspect of the present invention by a method of limiting the effects of the differential coefficient of thermal expansion of an electrical connector and a substrate to which the connector mounts, comprising the steps of: providing an electrical connector with a housing having an array of recesses that receive fusible elements to secure the connector to the substrate; defining at least one predetermined location on the housing; and manipulating the recesses located in the at least one predetermined location.

BRIEF DESCRIPTION OF THE DRAWINGS

Other uses and advantages of the present invention will become apparent to those skilled in the art upon reference to the specification and the drawings, in which.

DETAILED DESCRIPTION OF THE PREFERRED EMBODIMENTS

Figure 1:
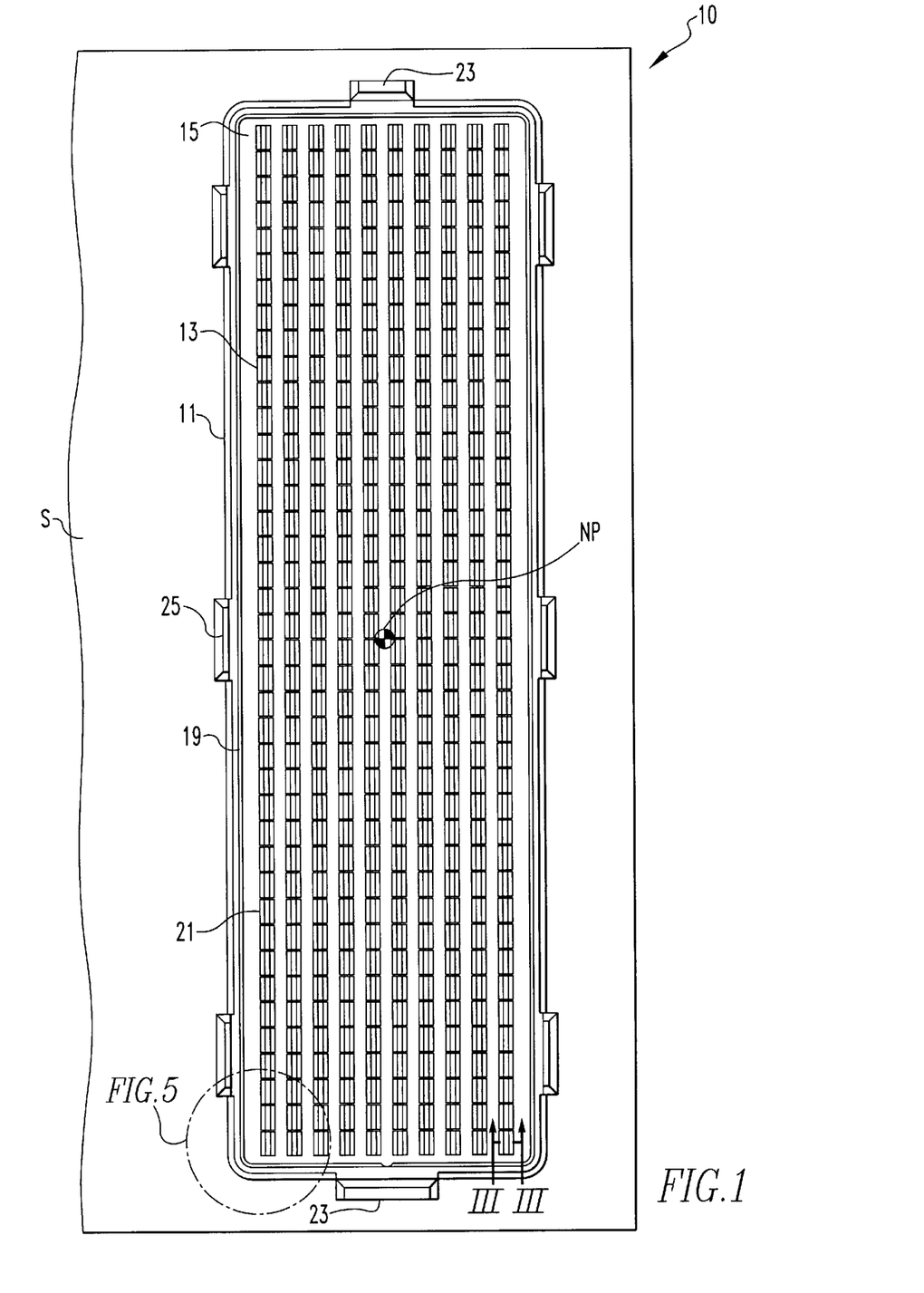
FIG. 1 is top view of an electrical connector utilizing the present invention.
Figure 2:
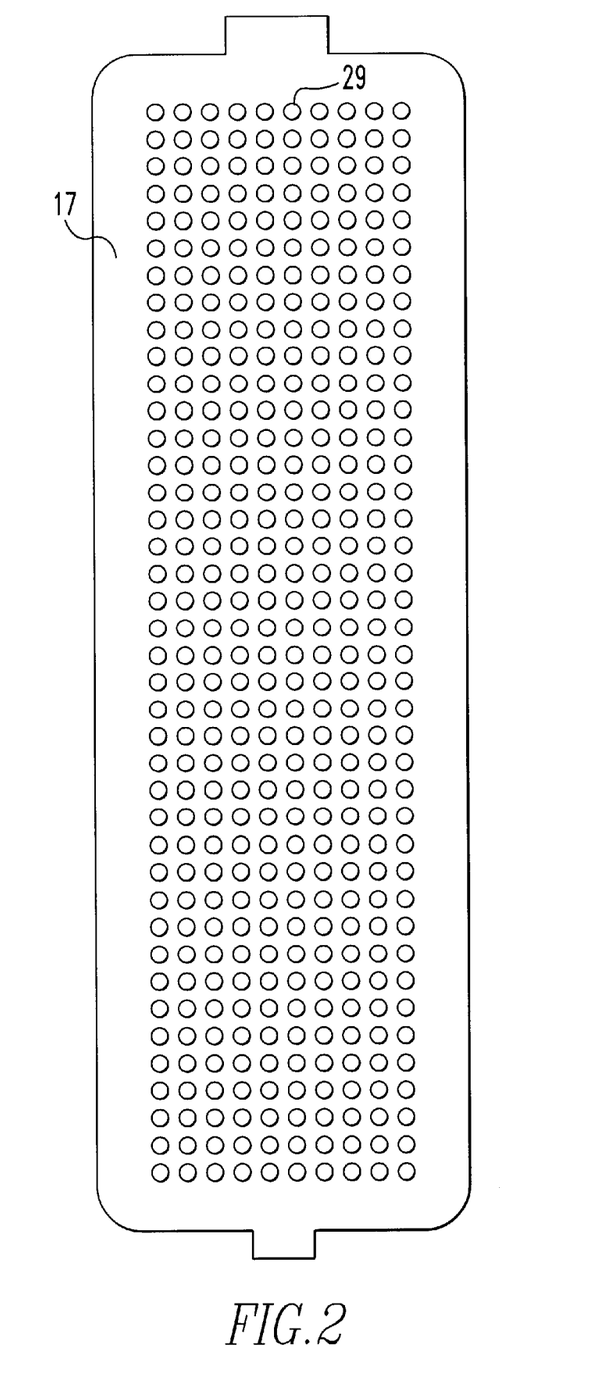
FIG. 2 is a bottom view of the electrical connector of FIG. 1.

As shown in FIGS. 1 and 2, the present invention relates to a surface mounted electrical connector 10. Array connector 10 has an insulative housing 11 made from a suitable material, preferably a thermoplastic such as LCP. Preferably injection molded, housing 11 includes a plurality of apertures 13 extending therethrough from a mating end 15 that faces a mating component, such as another electrical connector, to a mounting end 17 that faces a substrate S.

Housing 11 can include features that help align connector 10 when securing to the mating component. Housing 11 can include a peripheral wall 19 that provides rough alignment between connector 10 and the mating component before contacts 21 mate with corresponding features on the mating component. Housing 11 can also include polarization tabs 23 and guidance tabs 25 located around peripheral wall 19. Tabs 23, 25 ensure proper orientation, and rough alignment, of connector 10 and the mating component.

Figure 3:
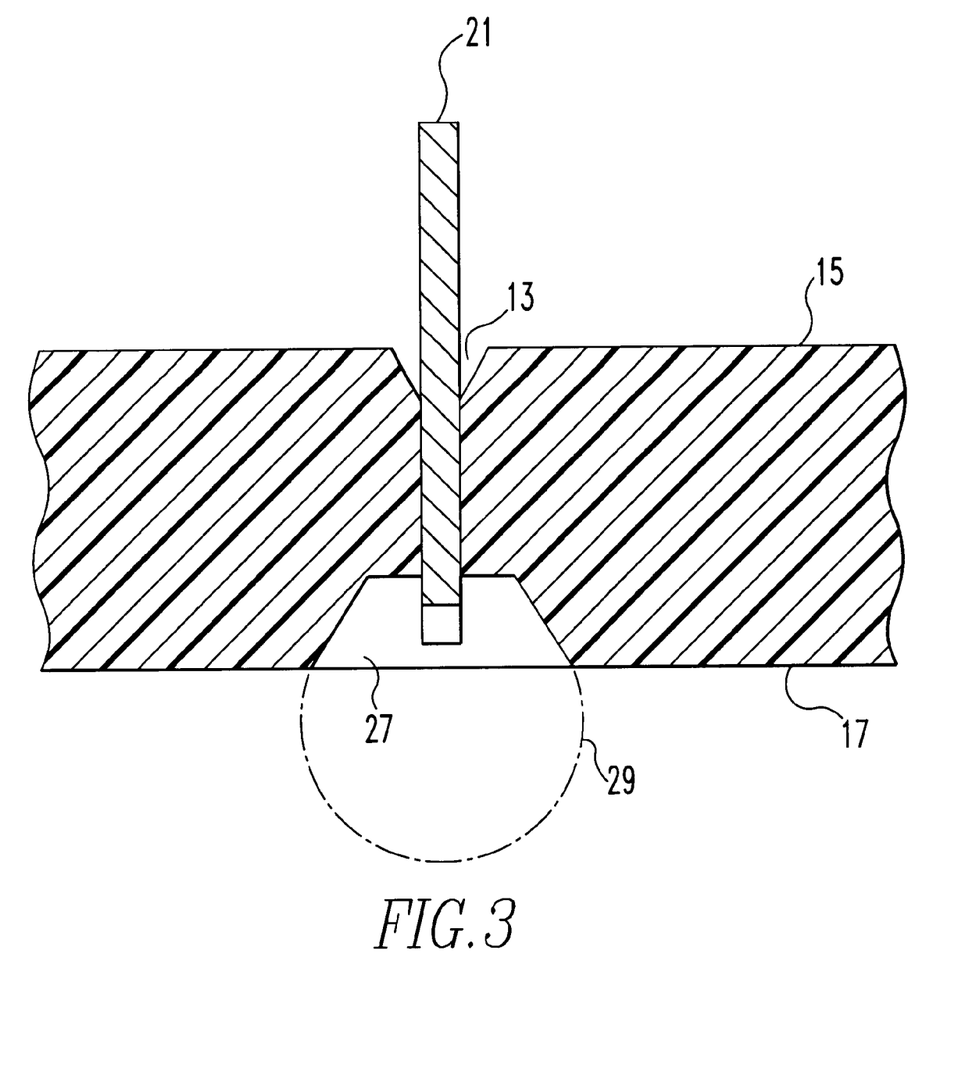
FIG. 3 is a cross-sectional view of the electrical connector of FIG. 1 taken along line III—III.

Apertures 13 receive corresponding contacts 21. Until the reflow process described below, contacts 21 remain within apertures 13 by a friction fit as shown in FIG. 3.

The end of aperture 13 adjacent mounting end 17 has an enlarged portion, or recess, 27. Enlarged portion 27 is generally concave in order to receive at least a portion of a fusible element 29 that secures to contact 21 by a reflow process. Fusible element 29, such as a solder ball, is used to surface mount connector 10 to substrate S. International Publication number WO 98/15989 (International Application number PCT/US97/ 18066), herein incorporated by reference, describes methods of securing a fusible element to a contact and of securing fusible elements to substrates.

Upon reflow, fusible element 29 fills in and takes the shape of enlarged portion 27. Due to this characteristic, the present invention manipulates the shape of apertures 13, particularly the shape of enlarged portions 27, to counteract the effects of CTE differential. Although the present invention could manipulate every aperture 13 in housing 11, the present invention preferably only manipulates certain apertures 13 as described below.

Figure 4A:
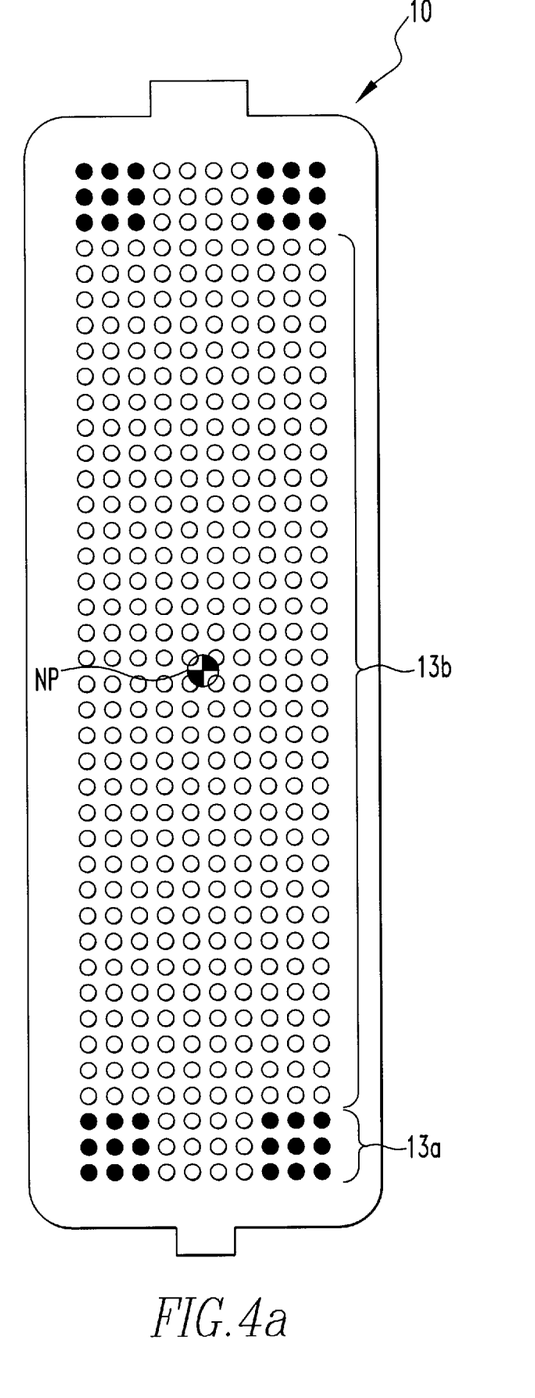
FIG. 4a is a bottom view of the electrical connector of FIG. 1 displaying possible preferential failure locations.
Figure 4B:
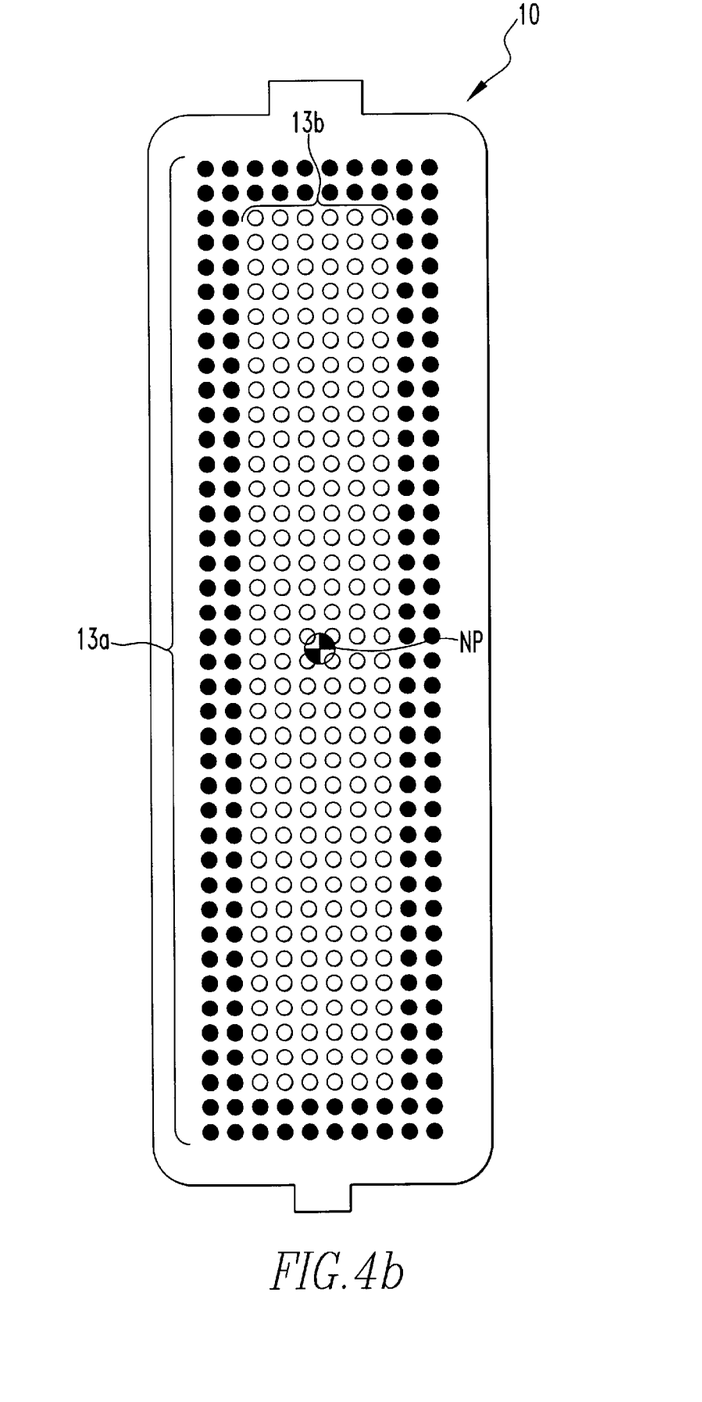
FIG. 4b is a bottom view of the electrical connector of FIG. 1 displaying other possible preferential failure locations.
Figure 4C:
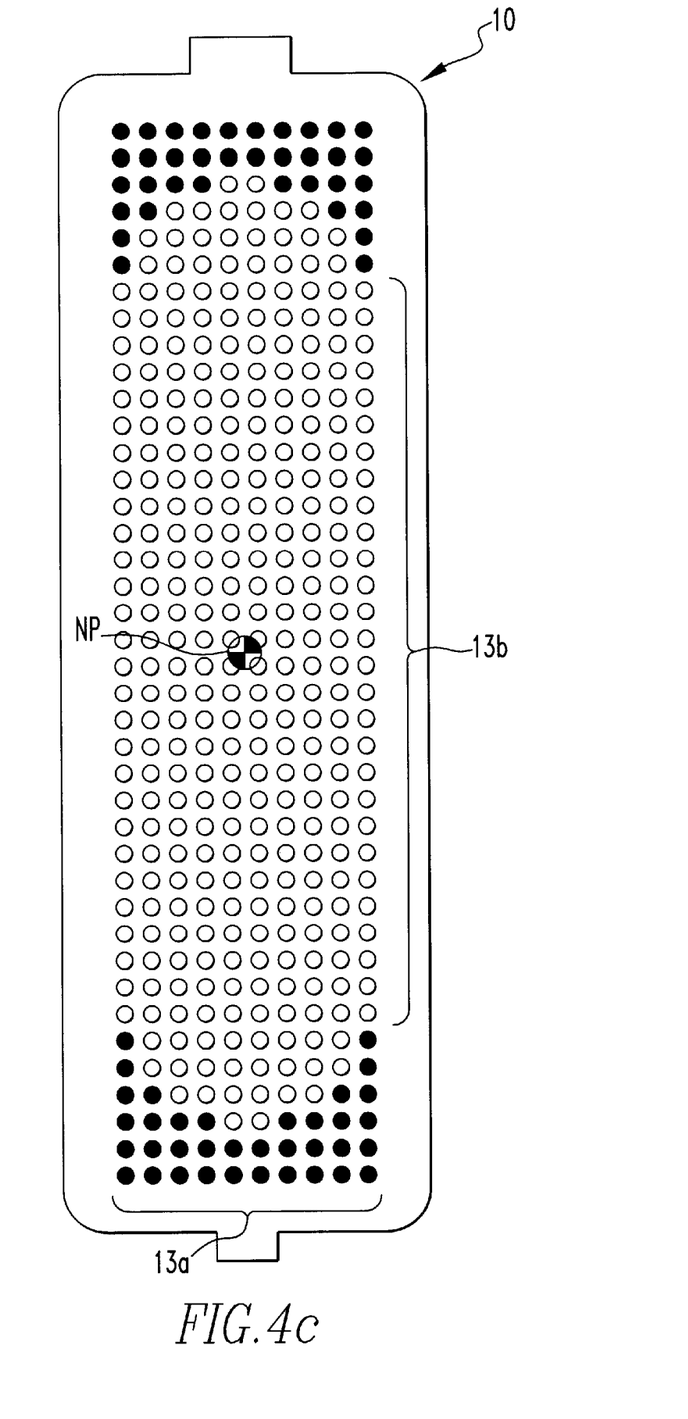
FIG. 4c is a bottom view of the electrical connector of FIG. 1 displaying other possible preferential failure locations.

FIGS. 4a–c provide several examples of which apertures 13 preferably receive the manipulation. Specifically, FIG. 4a provides that manipulated apertures 13a reside at the four corners of housing 11, while the remainder, or the non-manipulated apertures, 13b reside elsewhere. FIG. 4b provides that manipulated apertures 13a reside in the outermost rows and columns of housing 11, while the remainder, or non-manipulated apertures 13b, reside in interior rows and columns. FIG. 4c provides that manipulated apertures 13a reside both at the four corners and along the outermost rows and columns of housing 11, while the remainder, or non-manipulated apertures 13b, reside elsewhere.

The present invention manipulates the apertures that are located at preferential failure locations on connector 10. Preferential failure locations on connector 10 are locations that, either through estimation or actual experimentation, could fail during thermal cycling of connector 10.

As seen in FIGS. 1 and 4a–c, connector 10 has a neutral point NP. Neutral point NP defines the point at which there is no relative motion of connector 10 and substrate S in the X-Y plane during thermal cycling. Typically, neutral point NP is the geometric centroid of connector 10. Generally speaking, the preferential failure locations on connector 10 have the greatest distance to neutral point (DNP). In other words, manipulated apertures 13a preferably reside at positions with the greatest DNP. Conversely, the non-manipulated apertures 13b generally reside at positions with lesser DNPs.

Recognizing that FIGS. 4a–c merely provide three examples, the present invention could utilize any other manner of selecting which apertures 13 receive the manipulation. The specific structural manipulation will now be described with reference to FIGS. 5–7.

Figure 5:
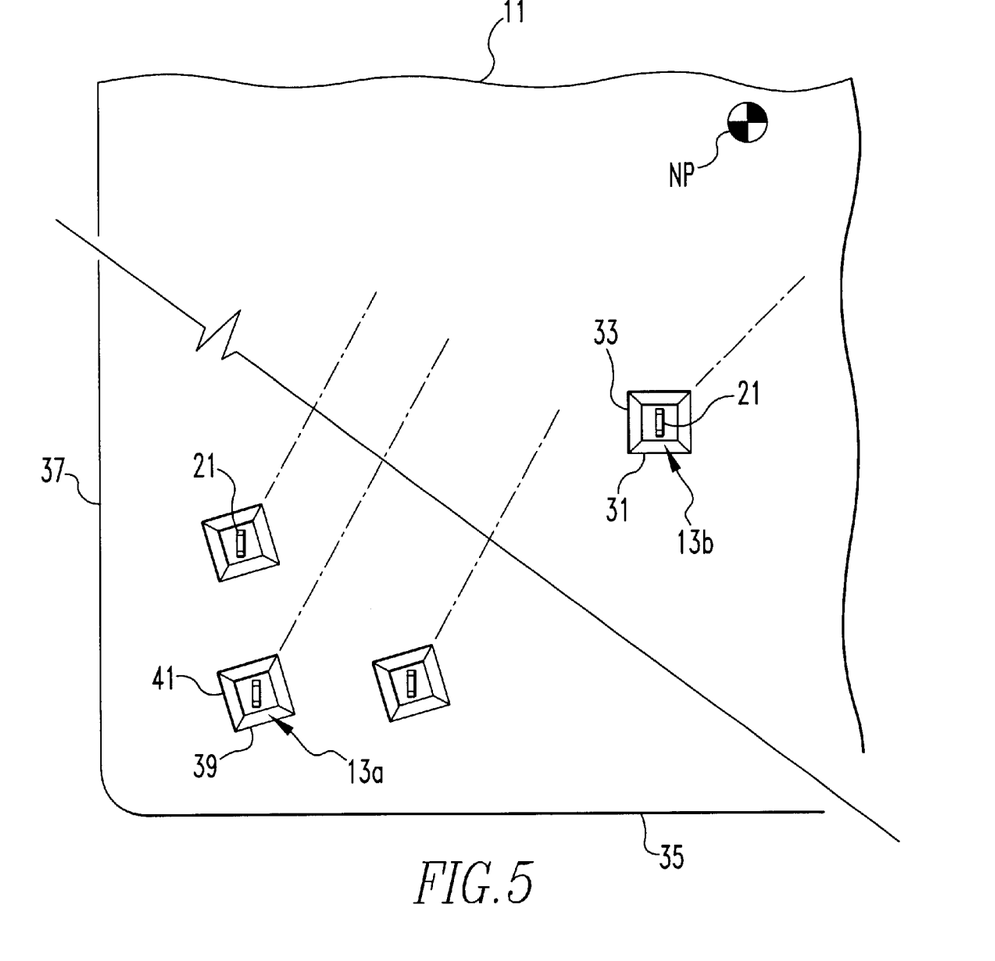
FIG. 5 is a detailed view of the bottom of the electrical connector of FIG. 1.

FIG. 5 displays both manipulated apertures 13a and non-manipulated apertures 13b. With the rectangular openings shown in FIG. 5, manipulated apertures 13a preferably have the same size as non-manipulated apertures 13b, but have a different orientation. Non-manipulated apertures 13b preferably have an orientation in which side walls 31, 33 defining each aperture 13b parallel side walls 35, 37 defining the perimeter of connector 10. Any other suitable orientation on housing 11, however, could be used.

As seen in FIG. 5, manipulated apertures 13a are misaligned with respect to non-manipulated apertures 13b. Manipulated apertures 13a preferably have an orientation such that side walls 39, 41 are not parallel to side walls 35, 37 of housing 11. In general terms, manipulated apertures 13a are rotated relative to non-manipulated apertures 13b. Preferably, manipulated apertures 13a are rotated so that the portion of recess 27 having the greatest cross-sectional area (which, in FIG. 5, would be the line between opposite corners) is directed more towards neutral point NP than non-manipulated apertures 13b.

As a result, more material from fusible element 29 exists along a path generally oriented towards neutral point NP. This provides increased strength to connector 10 during thermal cycling. The increased strength fortifies the junction between connector 10 and substrate S and between fusible element 29 and contact 21.

The amount of rotation of manipulated apertures 13a relative to non-manipulated apertures 13b depends on several factors. One main factor involves the material characteristics of housing 11, in particular the CTE. Another factor involves the size of connector 10. Each manipulated aperture 13a, since they reside at different locations on housing 11, could have a unique orientation relative to non-manipulated apertures 13b. Alternatively, groups of manipulated apertures 13a (such as each corner as shown in FIG. 4a) could have the same orientation relative to non-manipulated apertures 13b. This may help reduce the complexity of the mold preferably used to form housing 11.

Figure 6:
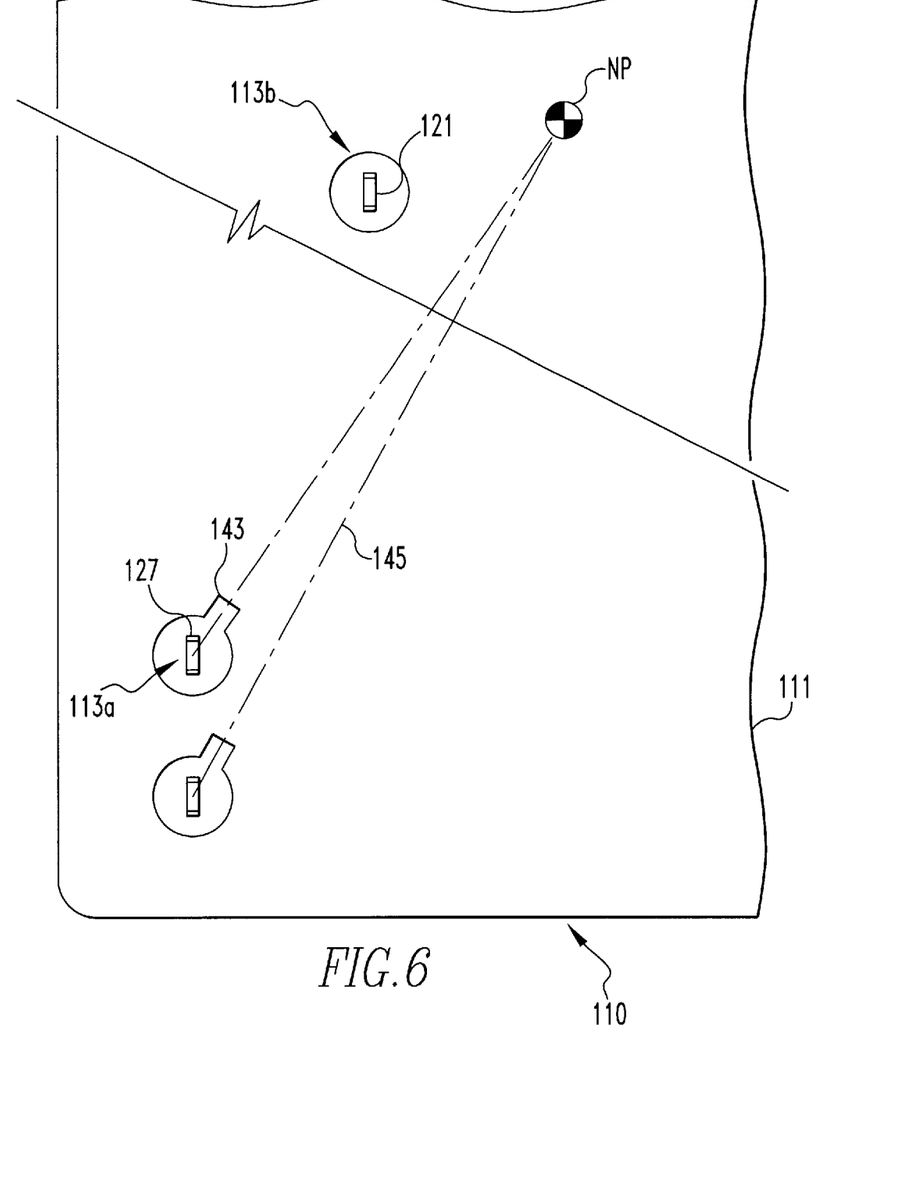
FIG. 6 is an alternative embodiment of the bottom of the electrical connector.

FIG. 6 displays an alternative embodiment of the present invention. This embodiment uses the same reference characters as the first embodiment, except for a change in the hundreds digit. Connector 110 includes an insulative housing 111 with apertures 113a, 113b that receive contacts 121. Enlarged portion, or recess, 127 of apertures 113a, 113b has the shape of a partial sphere within which a portion of a fusible element can reside in order to fuse to contact 121.

As with the earlier embodiment, housing 111 can include manipulated apertures 113a and non-manipulated apertures 113b. Preferably, manipulated apertures 113a include an additional recess 143 in communication with enlarged portion 127. During reflow, the fusible element will enter enlarged portion 127 and additional recess 143. As a result, the shape assumed by the reflowed fusible element includes an area of larger cross-sectional size.

As discussed earlier, only apertures that reside in preferential failure locations require additional recess 143. Accordingly, manipulated apertures 113a reside in the preferential failure locations, defined earlier as locations on the connector that, either through estimation or actual experimentation, may fail during thermal cycling. In other words, manipulated apertures 113a generally exist at positions having the greatest DNP.

While the use of additional recess 143 on recesses 113b may be unnecessary, such an arrangement could be used. In such an arrangement, apertures 113a would preferably have a different orientation than apertures 113b.

As with the earlier embodiment, this embodiment of the present invention allows selective positioning of additional recesses 143 in order to reduce the effects of CTE differential. As shown in FIG. 6, each recess 143 generally parallels a line 145 extending between aperture 113a and neutral point NP. Such an arrangement is preferred, for example, when the material forming insulative housing 111 is anisotropic. The term anisotropic herein refers to the condition where the material forming insulative housing 111 exhibits a different CTE value in the X-axis than in the Y-axis.

Although FIG. 6 displays each aperture 113a having a discrete orientation relative to neutral point NP, other arrangements are possible. For instance, and in order to reduce the complexity of the mold used to form housing 111, groups of apertures 113a (such as the groups at each corner of the housing as shown in FIG. 4a) could have a common orientation.

Figure 7:
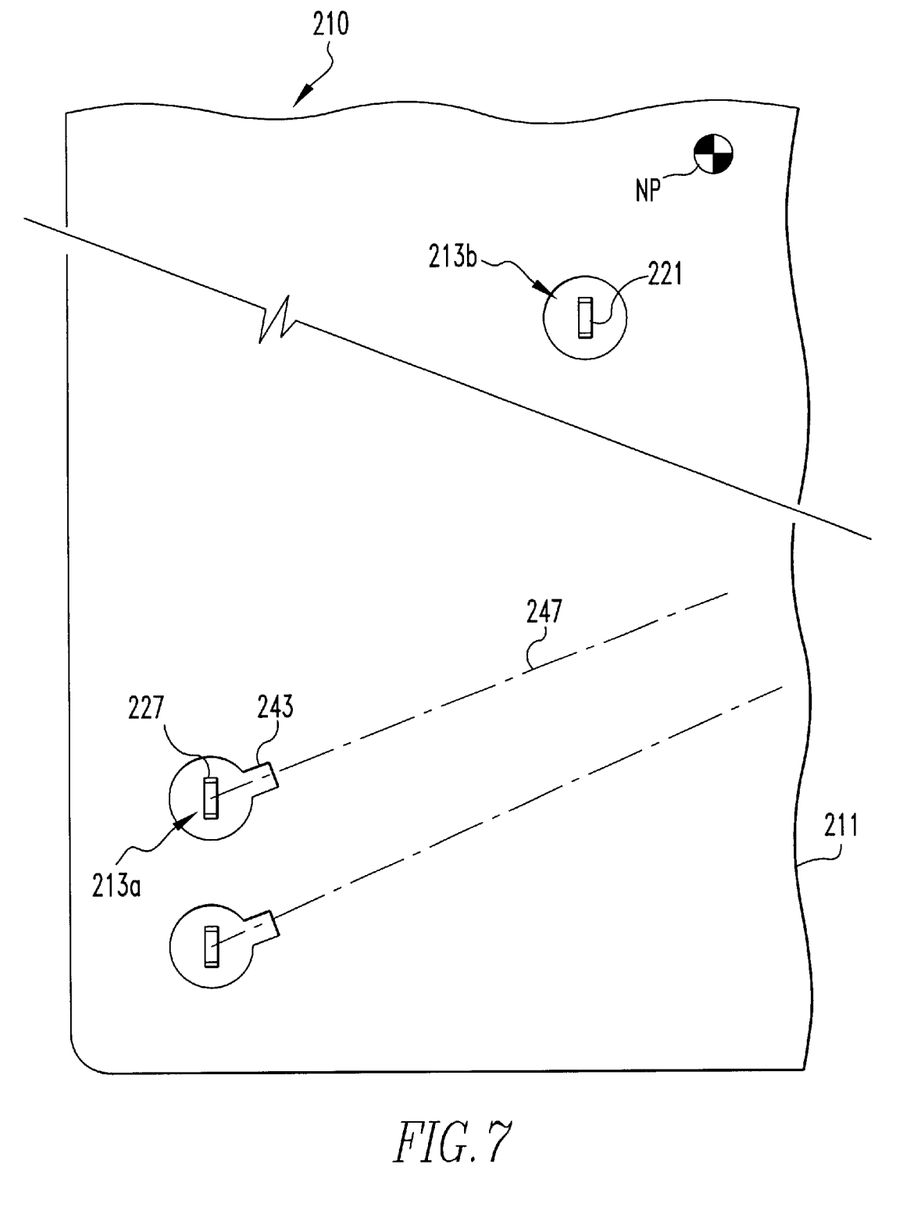
FIG. 7 is another alternative embodiment of the bottom of the electrical connector.

FIG. 7 displays another alternative embodiment of the present invention. This embodiment uses the same reference characters as the other embodiments, except for a change in the hundreds digit. Connector 210 includes an insulative housing 211 with apertures 213a, 213b that receive contacts 221. Enlarged portion, or recess, 227 of apertures 213a, 213b has the shape of a partial sphere within which a portion of a fusible element can reside in order to fuse to contact 221.

As with the earlier embodiments, housing 211 can include manipulated apertures 213a and non-manipulated apertures 213b. Preferably, manipulated apertures 213a include an additional recess 243 in communication with enlarged portion 227. During reflow, the fusible element will enter enlarged portion 227 and additional recess 243. As a result, the shape assumed by the reflowed fusible element includes an area of larger cross-sectional size.

As discussed earlier, only apertures that reside in preferential failure locations require additional recess 243. Accordingly, manipulated apertures 213a reside in the preferential failure locations, defined earlier as locations on the connector that, either through estimation or actual experimentation, may fail during thermal cycling. In other words, manipulated apertures 213a exist at positions having the greatest DNP. While the use of additional recess 243 on recesses 213b may be unnecessary, such an arrangement could be used. In such an arrangement, apertures 213a would preferably have a different orientation than apertures 213b.

As with the earlier embodiment, the present invention allows selective positioning of additional recess 243 in order to reduce the effects of CTE differential. Although no longer generally parallel to a line extending between aperture 213a and neutral point NP, FIG. 7 shows that each recess 243 parallels a line 247 extending between aperture 213a and a position on housing 211 located inwardly of aperture 213a. This orientation is preferred when the material forming insulative housing 11 is isotropic. The term isotropic herein refers to the condition where the material forming insulative housing 211 exhibits the same CTE value in the X-axis and the Y-axis.

Although FIG. 7 displays each aperture 213a having a discrete orientation, other arrangements are possible. For instance, and in order to reduce the complexity of the mold used to form housing 211, groups of apertures 213a (such as at each corner of the housing as shown in FIG. 4a) could have a common orientation.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. An insulative housing for an electrical connector, comprising:

a base; and an array of recesses in said base for receiving a fusible element for securing the connector to a substrate, each of said recesses having a cross sectional area, wherein at least some of said recesses have an enlarged cross-sectional area; and, wherein said recesses having said enlarged cross-sectional area are generally circular in shape, and said enlarged cross-sectional area includes a rectangular shape.

2. An electrical connector, comprising:

a housing having rectilinear edges defining a perimeter;

a recess in said housing, said recess having rectilinear edges defining a perimeter;

a contact secured to said housing and residing in said recess; and a fusible element residing in said recess and secured to said contact;

wherein said rectilinear edges of said recess are angled relative to said rectilinear edges of said housing.

* * * * *